United States Patent
Pignatelli et al.

(10) Patent No.: US 10,043,575 B2
(45) Date of Patent: Aug. 7, 2018

(54) MEMORY SYSTEM WITH READ THRESHOLD ESTIMATION AND OPERATING METHOD THEREOF

(71) Applicant: SK hynix Inc., Gyeonggi-do OT (KR)

(72) Inventors: David Pignatelli, Saratoga, CA (US); Fan Zhang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/663,527

(22) Filed: Jul. 28, 2017

(65) Prior Publication Data

US 2018/0047444 A1 Feb. 15, 2018

Related U.S. Application Data

(60) Provisional application No. 62/373,242, filed on Aug. 10, 2016.

(51) Int. Cl.
*G11C 16/26* (2006.01)
*G11C 11/56* (2006.01)
*G06F 3/06* (2006.01)
*G11C 16/28* (2006.01)
*G11C 29/52* (2006.01)
*G11C 29/00* (2006.01)
*G11C 16/04* (2006.01)

(52) U.S. Cl.
CPC ........ *G11C 11/5642* (2013.01); *G06F 3/0614* (2013.01); *G06F 3/0647* (2013.01); *G06F 3/0653* (2013.01); *G06F 3/0679* (2013.01); *G11C 16/28* (2013.01); *G11C 29/52* (2013.01); *G11C 29/76* (2013.01); *G11C 16/0458* (2013.01); *G11C 16/0483* (2013.01); *G11C 16/26* (2013.01)

(58) Field of Classification Search
CPC ..... G11C 11/5642; G11C 16/28; G11C 16/34; G11C 29/52; G11C 29/76; G11C 16/0458; G11C 16/0483; G11C 16/26
USPC ........................ 365/185.93, 185.21, 185.24
See application file for complete search history.

(56) References Cited

U.S. PATENT DOCUMENTS

| | | | |
|---|---|---|---|
| 9,058,890 B2 | 6/2015 | Kang | |
| 2008/0205152 A1* | 8/2008 | Kang | G11C 11/5642 365/185.18 |
| 2012/0063227 A1* | 3/2012 | Weingarten | G11C 11/5628 365/185.09 |
| 2012/0269007 A1* | 10/2012 | Yang | G11C 7/00 365/189.05 |
| 2016/0202934 A1 | 7/2016 | Pignatelli et al. | |

\* cited by examiner

*Primary Examiner* — Tan T. Nguyen
(74) *Attorney, Agent, or Firm* — IP & T Group LLP

(57) ABSTRACT

An apparatus of a memory system and an operating method thereof includes a plurality of memory devices; and a controller coupled to the plurality of memory devices, wherein the controller is configured to perform a symmetric OVS read with at least an initial read threshold, and create a symmetric read result; perform an asymmetric OVS read with at least the initial read threshold, and create an asymmetric read result; adjust the initial read threshold according to at least the symmetric read result and asymmetric read result, and create an optimal read threshold; and execute data recovery process with the optimal read threshold.

19 Claims, 7 Drawing Sheets

MEMORY SYSTEM WITH READ THRESHOLD ESTIMATION AND OPERATING METHOD THEREOF

CROSS-REFERENCES TO RELATED APPLICATIONS

This application claims the benefit of U.S. Provisional Application No. 62/373,242 filed Aug. 10, 2016, the entire contents of which are incorporated herein by reference.

BACKGROUND

Field of Invention

Exemplary embodiments of the present disclosure relate to a memory system and an operating method thereof.

Description of Related Arts

In NAND flash storage systems, the read reference voltages are used to divide the possible threshold voltage range of NAND flash memory cells to several windows. A logical value is designated to each of the windows. The logical value of a cell is determined by the voltage window which the cell's threshold voltage is located in. For example, for a single-level cell (SLC), one read reference voltage is needed. When the threshold voltage of a cell is less than the specified read reference voltage, the logical value of the cell sets to "1"; otherwise, the cell's logical value sets to "0". For a multi-level cell (MLC), three read reference voltages are used. For a triple level cell (TLC) device, there are seven read reference voltages.

The threshold voltage of a cell can vary from its intended value for various reasons, such as program and read operation of neighboring cells, the number of program/erase cycles, and the retention time. Therefore, it is possible that the threshold voltage of a cell with an intended value shifts into another voltage window with a different logical value. In this case, when the cell is read, a wrong logical value is given and this error will be counted in the raw bit error rate (RBER) measurement. An optimal read reference voltage can achieve the minimal RBER.

Currently, there are two types of algorithm for the error-correction control solution, the hard-decoding algorithm and the soft-decoding algorithm. For the hard-decoding algorithm, the hard information which indicates that the input information is "0" or "1" is used. However, the soft information is used for the soft-decoding algorithm, which not only tells the decoder if the input information is "0" or "1", but also provides the decoder how likely it is "0" of "1". Usually if soft information is provided, a soft-decoding algorithm provides a better error correction performance than a hard-decoding algorithm. In NAND flash storage systems, an error-correction control solution will try the hard decoding first. When the hard decoding fails, the soft-decoding algorithm will be used.

Thus, there remains a need for a memory system and operating method thereof for read threshold estimation and adjustment.

SUMMARY

Embodiments of the present disclosure are directed to a memory system and an operating method thereof capable of locating optimal read reference voltages of the memory system.

In accordance with an embodiment of the present invention, there is provided an operating method of a memory system which includes performing a symmetric OVS read with at least an initial read threshold, and creating a symmetric read result; performing an asymmetric OVS read with at least the initial read threshold, and creating an asymmetric read result; adjusting the initial read threshold according to at least the symmetric read result and asymmetric read result, and creating an optimal read threshold; and executing data recovery process with the optimal read threshold.

In accordance with an embodiment of the present invention, there is provided an apparatus of a memory system which includes a memory system and an operating method thereof includes: a plurality of memory devices; and a controller coupled to the plurality of memory devices, wherein the controller is configured to: perform a symmetric OVS read with at least an initial read threshold, and create a symmetric read result; perform an asymmetric OVS read with at least the initial read threshold, and create an asymmetric read result; adjust the initial read threshold according to at least the symmetric read result and asymmetric read result, and create an optimal read threshold; and execute data recovery process with the optimal read threshold.

In accordance with an embodiment of the present invention, there is provided a memory system which includes a processor; a tangible computer readable storage medium coupled to the processor, embedding the non-transitory computer program product executed by the processor, including computer instructions configured to: perform a symmetric OVS read with at least an initial read threshold, and create a symmetric read result; perform an asymmetric OVS read with at least the initial read threshold, and create an asymmetric read result; adjust the initial read threshold according to at least the symmetric read result and asymmetric read result, and create an optimal read threshold; and execute data recovery process with the optimal read threshold.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
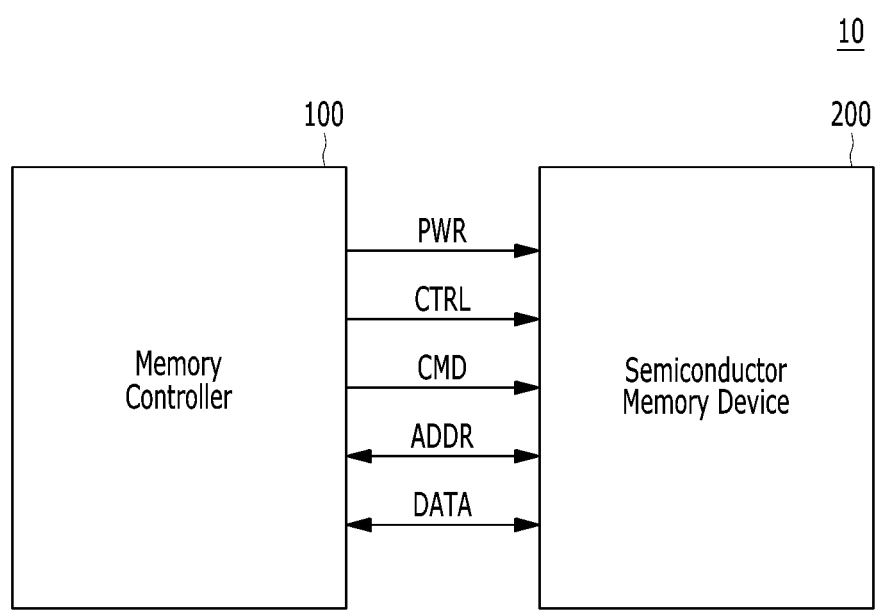
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In NAND flash memories, information is stored by cell levels. A read is performed by comparing a read threshold to a cell voltage. If the cell voltage is higher than the read threshold, a '0' is read, otherwise a '1' is read, as read result. Today's latest NAND products, such as TLC device, using 3-bit per cell charge distributions to encode user data makes it especially critical to set the seven different read thresholds correctly. A performance drop may occur when the read thresholds are not correctly set and Uncorrectable ECC Errors (UECC) are created.

In a typical SSD, this leads to several additional reads, following a procedure called Read Retry, to perform blind (probabilistic) threshold adjustment in attempts to correctly (hard) decode the erroneous data. Latency for these errors can increase 6 to 10 times, resulting in degraded performance. Since 3D TLC NAND has multiple threshold shifting scenarios, this degradation is not limited to End of Life (EOL) conditions. Rather, these errors would plague a relatively new SSD, and therefore a method is demanded to properly estimate the NAND distribution shift, so that the correct read thresholds can be obtained. Traditionally, this process is expensive in terms of additional specialized hardware and internal memory arrays to perform conditional one's counting and to store "Assist Read" data, and also in terms of additional NAND Read overhead to obtain Assist Read buffers, and multiple "slicing" reads to estimate the shape and cross-over position of the NAND cell charge distributions.

In embodiments of the present disclosure, an efficient method to evaluate a given read threshold setting and determine a better threshold is proposed. The method helps to mitigate the high number of extra NAND reads and data transfers from the NAND array to the controller, as well as simplify the SoC logic needed to implement the process. As a result, the SSD performance is maintained throughout the life of the NAND.

FIG. 1 is a block diagram schematically illustrating a memory system 10 in accordance with an embodiment of the present invention. Referring FIG. 1, the memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid-state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
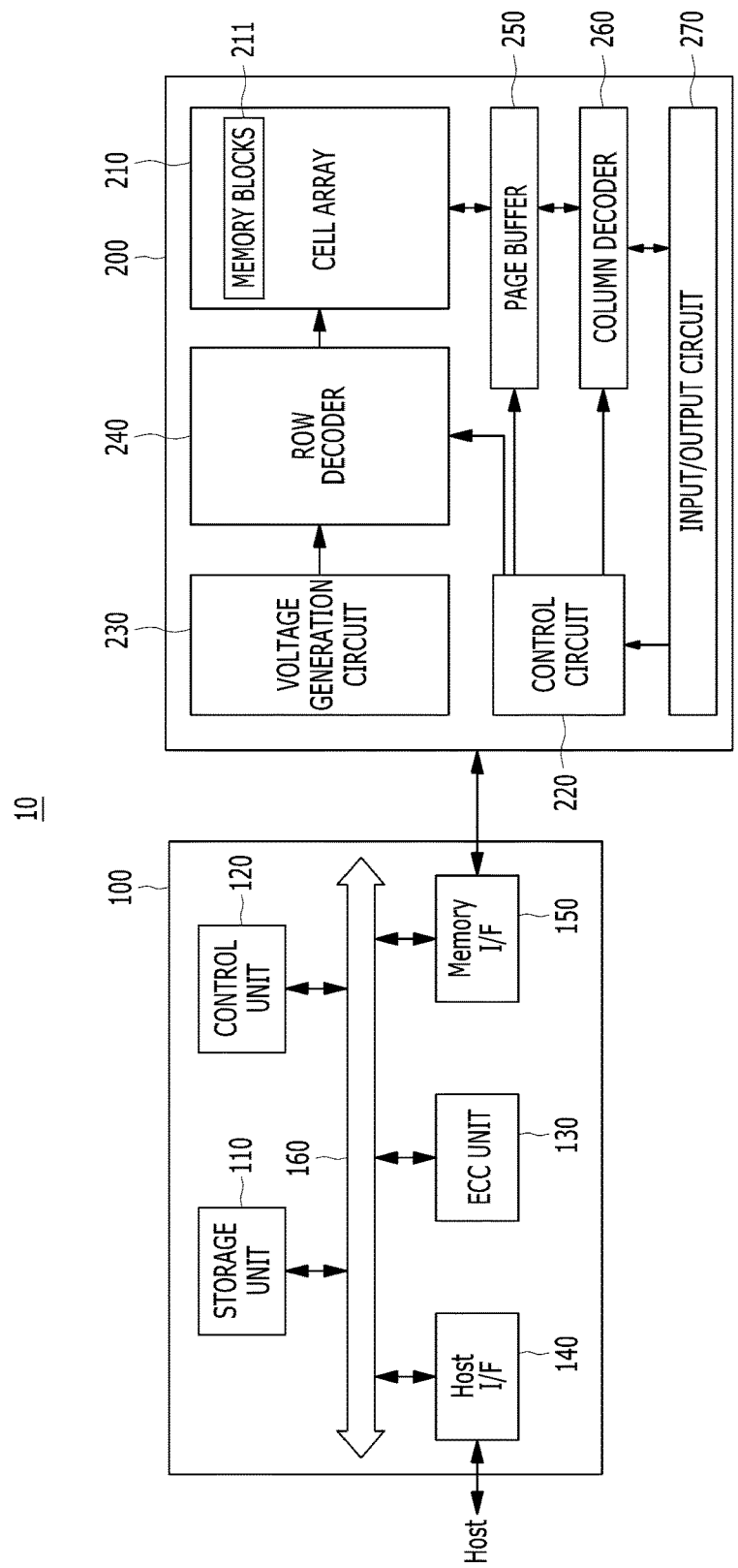
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random-access memory (DRAM) and a static random-access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random-access memory (FRAM), a phase change RAM (PRAM), a magnetoresistive RAM (MRAIVI) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random-access memory (SRAM) or a dynamic random-access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220. The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270. The control circuit 220 may control the peripheral circuit in response to the command and the address.

Figure 3:
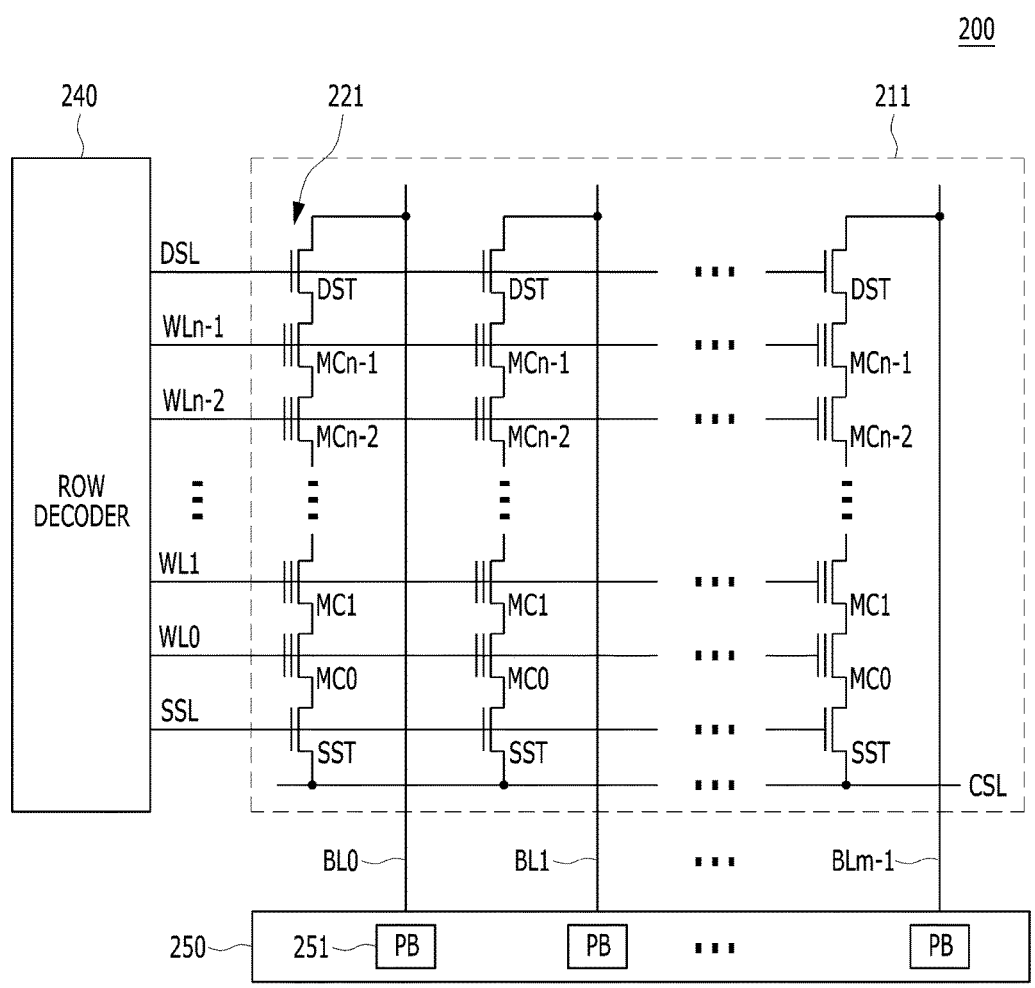
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

In current SSD firmware (FW) implementation, UECC errors can occur because the correct read threshold is not appropriately set in the NAND device, and in fact, the correct threshold may not be known. When the Read Retry is attempted, the alternate read threshold settings used are essentially a collection of well-formed guesses. Unfortunately, as the 3D TLC NAND continues to develop, the number of different Read Retry settings (the collection size) keeps growing. Currently, there are nearly a dozen different read retry positions. From a system view, performing twelve additional reads, decoding, and trying again, such as through parameter settings and new NAND read commands, is an unacceptably long latency.

A more efficient method may be to directly evaluate the current threshold position, correct the threshold, and then perform a single additional read attempt to recover the hard data. Utilization of a combination of two Over Sampling NAND reads can estimate not only the magnitude of the read threshold error, but additionally, the direction (+/−) of the error. With these results, and the equivalent cost of just four NAND read delays and a single decoding delay, the low latency performance of the SSD can be maintained while meeting the required reliability.

Additionally, prior to reaching the UECC reliability condition, most SSD FW algorithms can implement a background media scan operation, such that proactive data recovery prevents data loss. During such traditional operations, data across the entire SSD can be sampled systematically, and decoded by the ECC function. Although there is no UECC, some number of correctable errors can be reported by the ECC decoder. When the current background media scan read quality drops to the point where 70% or more of the ECC error correction capacity consumed, the data can be scheduled for reclamation (forced GC). This reclamation process can represent user performance loss not only in instantaneous latency and throughput, but also in longevity. However, the NAND data may not actually need reclamation but simply a better threshold setting. Switching to the new method of threshold evaluation may allow proactive choice of more optimum read thresholds, so that when 70% of the ECC correction capacity is consumed, the data reclamation may represent the most frugal usage of the NAND endurance.

From the NAND data, the optimal read threshold can be dependent on several parameters such as erase/write (E/W) cycle, word line (WL) index, block temperature, early retention indicator, and read disturbance, etc. Based on these parameters, the optimal read threshold can be found out accurately by measuring NAND beforehand. In the previous described method, these different threshold choices can be processed using clustering algorithms to minimize the size of the controller read threshold table. However, even with pre-calculation and parameter optimization, real time conditions may vary over a significant range. Therefore, to prevent needless UECC processing, these optimization tables can be periodically checked to validate and modify the threshold settings, if necessary, so that UECC and Read Retry events can be greatly reduced.

In order to understand the benefit of the method disclosed in the embodiments of the present invention, it is necessary to describe the method which can help to replace. The TLC NAND (actually uses eight levels not three to represent the stored data) can require substantial processing overhead to make estimation of the cell distributions from which optimized read thresholds can be chosen. Due to the fact that each threshold region may fall prey to different degradation mechanisms, the threshold voltages may shift in opposite directions, and thus it is important to clearly estimate each associated cross-over region.

The constituent least significant bit (LSB), center significant bit (CSB), and most significant bit (MSB) pages stored in the TLC NAND cell each can require a different subset of the seven read thresholds, numbered V1 through V7, to decode data during any given NAND Read operation. For the purpose of this discussion, assume the LSB page uses V3 and V7, the CSB page uses V2, V4, and V6, while finally, the MSB page uses V1 and V5. Unlike simple SLC NAND, which requires a single threshold, the LSB and MSB TLC pages use two different thresholds. Thus, for each stored cell, the LSB and MSB TLC pages can require an additional Assist Read to isolate, which threshold is needed to decode the "1" and "0" state. The CSB TLC page requires three thresholds, and therefor requires two Assist Reads.

Each Assist Read can be a coarse hard slicing to determine, in a gross sense, what area of the allowable distribution space that each bit cell is defined from. Using this information, it is possible to understand the key decoding threshold usage for the aggregate of bits read from the NAND page. Since the form of estimating the distribution uses a technique of ones counting while using a sweep of 8 to 10 threshold voltages across the different regions, this method may require virtually one dozen different NAND tRD cycles just to estimate the threshold values. In addition to the original UECC read, at least one more read can be still required to decode the data, and can result in Read latency approaching 2 ms. Clearly, using this method to proactively estimate and adjust read threshold is not possible.

In addition to a normal Page Read, the NAND device can support a useful feature called Oversampling (OVS) Read. An OVS Read can result in two data transfers to the controller. The OVS Read can perform a normal read with the current thresholds, the result of this typically is called the "hard data", which can be transferred to the controller first. The NAND device also can store this data internally and then proceed to perform two additional reads, with each read altering the read thresholds above and below the nominal value by a programmed amount. The data from each of the two subsequent reads can be compared to the original hard read to create the second data buffer transferred to the controller. The second data buffer indicates, per data bit, the values which would be considered to have low confidence, or perhaps indicate "erasure" positions, which is called the "erasure data".

Figure 4:
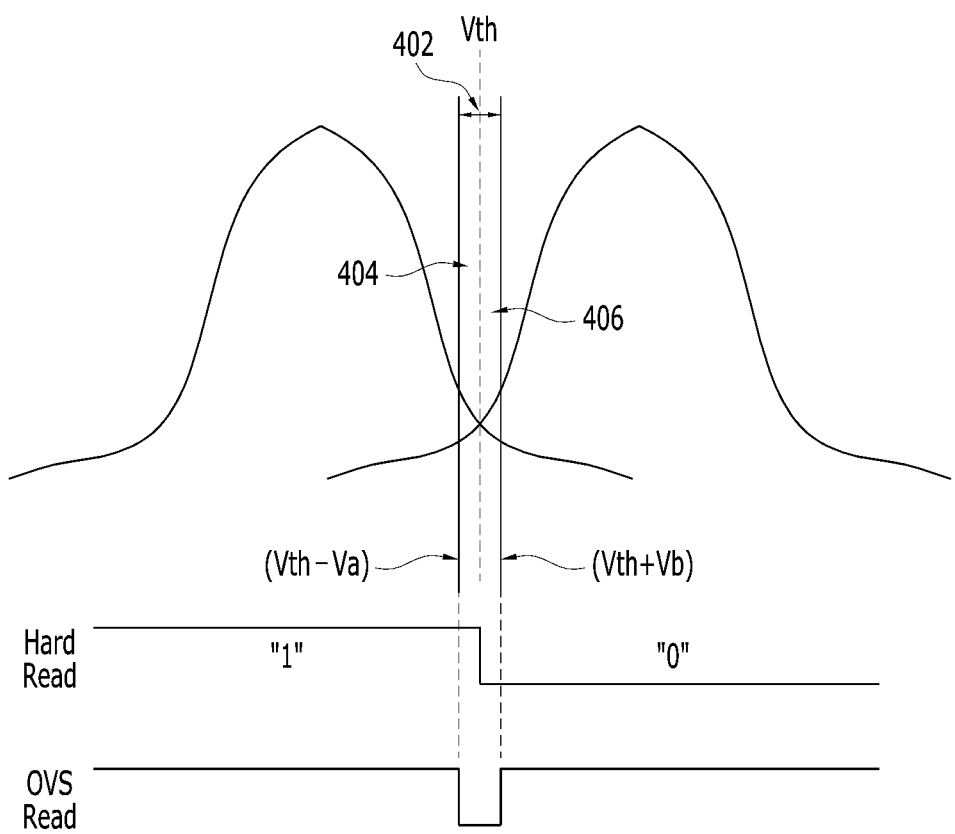
FIG. 4 is a diagram illustrating NAND symmetric OVS Read definition of a memory system in accordance with an embodiment of the present invention.

FIG. 4 is a diagram illustrating NAND symmetric OVS Read definition of a memory system in accordance with an embodiment of the present invention. As shown in FIG. 4, the read distributions can cross with each other, where the cross point can be defined as the read threshold Vth.

The OVS Read can be characterized by essentially three values, hard read thresholds Vth[k], lower threshold shift value Va[k], and higher threshold shift value Vb[k], wherein k is an integer representing iteration number of the read.

During the OVS Read process, for iteration k, the first read can be conducted using read threshold Vth[k], the second read can be conducted using thresholds (Vt[k]−Va[k]), the third read can be conducted using thresholds (Vt[k]+Vb[k]). The OVS Read can include Symmetric OVS Read and Asymmetric OVS Read. When Va[k]=Vb[k], the OVS Read is the Symmetric OVS Read, while Va[k] !=Vb[k], the OVS Read is the Asymmetric OVS Read, for each k.

As shown in FIG. 4, the read threshold Vth is at the center of a shift area 402, while the lower threshold shift value Va 404 is equal to the higher threshold shift value Vb 406, in the Symmetric OVS Read. The lower threshold shift value Va 404 and the higher threshold shift value Vb 406 can be programmed by the memory system in accordance with the memory system configuration. The First read can be conducted using the read threshold Vth, such that, if the cell voltage is higher than the read threshold Vth, the Hard Read is '1', and if the cell voltage is lower than the read threshold Vth, the Hard Read is '0'. The Hard Reads can be transferred to the memory controller 100, and also can be stored internally.

Two additional reads can be conducted using the read thresholds above and below the nominal read threshold Vth by a programmed amount. The second read can be conducted using a lower threshold Vth-Va, which is lower than the normal read threshold Vth by Va. When the cell voltage is higher than the lower threshold Vth-Va, the OVS Read is '1', and when the cell voltage is lower than the lower threshold Vth-Va, the OVS Read is '0'.

The third read can be conducted using a higher threshold Vth+Vb, which is higher than the normal read threshold Vth by Vb. When the cell voltage is higher than the higher threshold Vth+Vb, the OVS Read is '1', and when the cell voltage is lower than the higher threshold Vth+Vb, the OVS Read is '0'. The cell values read from the shift area 402 are '0's, while cell values read out of the shift area 402 are '1's. The width of the shift area 402 is equal to Va+Vb, wherein Va=Vb.

The data from each of the two subsequent reads, such as the second read and the third read, can be compared to the original hard read to create the second data buffer transferred to the memory controller 100. The second data buffer indicates, per data bit, the values which could be considered to have low confidence, or perhaps indicate "erasure" positions, which is called the "erasure data".

Figure 5:
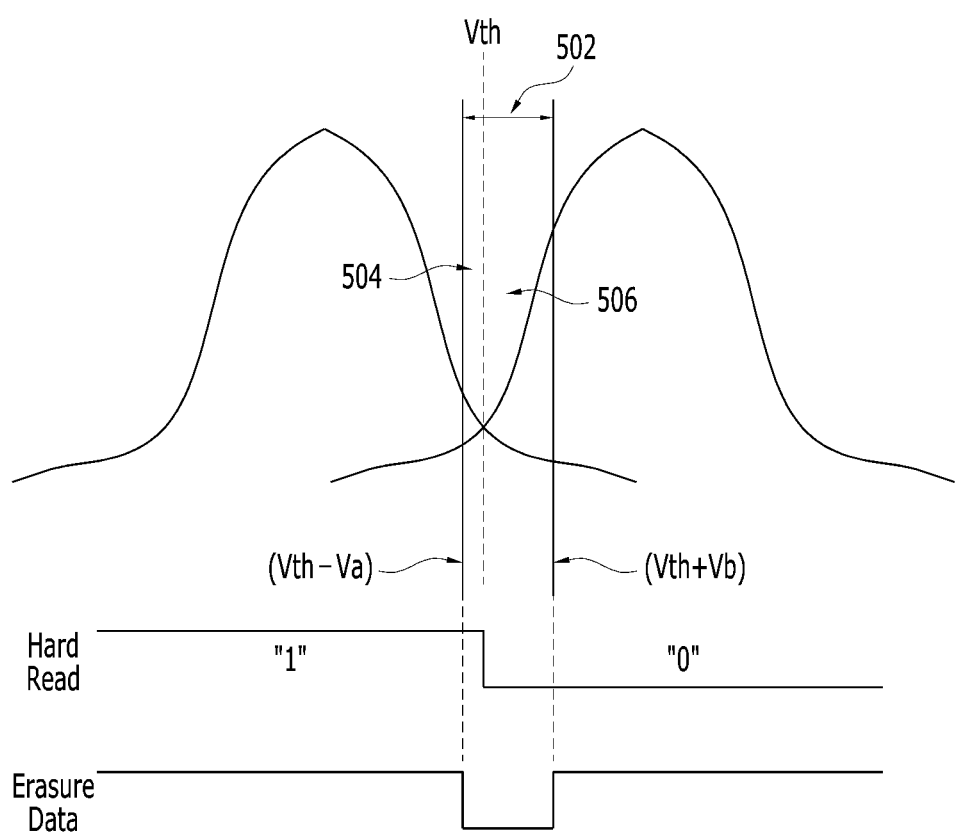
FIG. 5 is a diagram illustrating NAND Asymmetric OVS Read definition of a memory system in accordance with an embodiment of the present invention.

FIG. 5 is a diagram illustrating NAND Asymmetric OVS Read definition of a memory system in accordance with an embodiment of the present invention. As shown in FIG. 5, the read distributions can cross with each other, where the cross point can be defined as the read threshold Vth.

As shown in FIG. 5, the read threshold Vth is within a shift area 502, defined by a lower threshold shift value Va 504 and a higher threshold shift value Vb 506, wherein the lower threshold shift value Va 504 is not equal to the higher threshold shift value Vb 506, in the asymmetric OVS Read. The lower threshold shift value Va 504 and the higher threshold shift value Vb 506 can be programmed by the memory system in accordance with the memory system configuration. The first read can be conducted using the read threshold Vth, such that, if the cell voltage is higher than the read threshold Vth, the Hard Read is '1', and if the cell voltage is lower than the read threshold Vth, the Hard Read is '0'. The Hard Reads can be transferred to the memory controller 100, and also can be stored internally.

Two additional reads can be conducted using the read thresholds above and below the nominal read threshold Vth by a programmed amount. The second read can be conducted using a lower threshold Vth-Va, which is lower than the normal read threshold Vth by Va. When the cell voltage is higher than the lower threshold Vth-Va, the OVS Read is '1', and when the cell voltage is lower than the lower threshold Vth-Va, the OVS Read is '0'.

The third read can be conducted using a higher threshold Vth+Vb, which is higher than the normal read threshold Vth by Vb. When the cell voltage is higher than the higher threshold Vth+Vb, the OVS Read is '1', and when the cell voltage is lower than the higher threshold Vth+Vb, the OVS Read is '0'. The cell values read from the shift area 402 are '0', while read out of the shift area 402 are '1'. The width of the shift area 402 is equal to Va+Vb, wherein the lower threshold shift value Va is not equal to the higher threshold shift value Vb.

The data from each of the two subsequent reads, such as the second read and the third read, can be compared to the original hard read to create the second data buffer transferred to the memory controller 100. The second data buffer indicates, per data bit, the values which could be considered to have low confidence, or perhaps indicate "erasure" positions, which is called the "erasure data".

Figure 6:
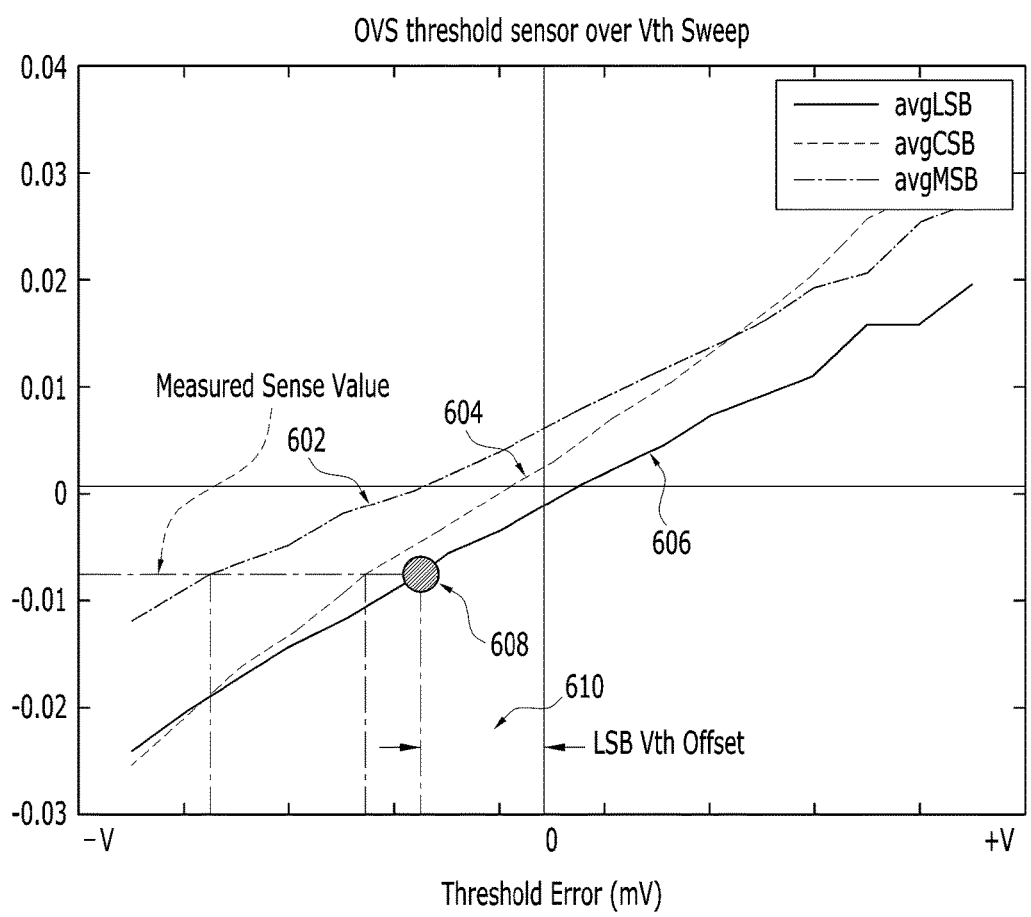
FIG. 6 is a diagram illustrating optimal threshold estimation of a memory system in accordance with an embodiment of the present invention.

FIG. 6 is a diagram illustrating optimal threshold estimation of a memory system in accordance with an embodiment of the present invention. FIG. 6 shows examples of the sense curves including an average MSB 602, an average CSB 604, and an average LSB 606, wherein the read threshold offsets can be directly located on the sense characterization curves in accordance with the measured sense values, respectively. The sense curves are almost linear instead of curved, a plurality of algorithms can be utilized to linearize the sense curves.

In details, the threshold estimation method described in the embodiments of the present invention can be as follows.

1. Perform a Symmetric OVS Read using an initial read threshold Vth[k] believed to be the optimal read threshold value, and predetermined values of Va[k] and Vb[k], wherein k is an integer. The hard data read in accordance with the Vth[k] can be stored in the hard data buffers, the erasure data read in accordance with the Va[k] and Vb[k] can be stored in the erasure data buffers.

2. Perform an Asymmetric OVS Read, using the same read threshold Vth[k], however, the values of Va[k] and Vb[k] are adjusted, such as Va'[k] and Vb'[k], to create a known bias in the cross-over region, such as the shift area 402 of FIG. 4. The hard data read in accordance with the Vth[k] can be stored in the hard data buffers, the erasure data read in accordance with the Va'[k] and Vb'[k] can be stored in the erasure data buffers.

3. Using the two hard data buffers, perform primitive 1's counting and compare the 1's count of each buffer to estimate the optimal threshold setting read noise, which is the difference between the 1's count of the two hard read in the hard data buffers.

4. Using the two erasure data buffers, perform primitive 1's counting and compare the number of erasure bits of the Asymmetric OVS Read and Symmetric OVS Read (Asym–Sym). This value, the difference of the numbers of erasure bits, is the threshold Sense value, which is marked at the vertical coordination in FIG. 6.

Wherein, the primitive 1's counting can be a count of data bits sampled in the "1" state, may require NO assist reads, and may only require storage to maintain the counts.

5. Compare the Sense values to characterization curves representing LSB, CSB, and MSB threshold offsets to the Sense values, respectively, and estimate the threshold offsets based on the Sense values, respectively. The characterization curves are pre-calculated from actual NAND distribution data. In accordance with the characterization curves shown in FIG. 6, the threshold offsets can be determined in accordance with the sense values, respectively. For a known sense value, a corresponding point can be located on the characterization curves, the x coordination of the corresponding point on the characterization curves can be determined as the threshold offset or threshold error. The initial threshold then can be estimated and adjusted in accordance with the threshold offset.

The threshold estimation and adjustment may be needed in two areas. In the first area, the UECC may be occurred and a new threshold may need be chosen for the next hard decoding iteration, with an UECC recovery algorithm. In the second area, background threshold assessment and adjustment, and database of optimized read threshold may need to be updated proactively to current real-time conditions, with a proactive background threshold estimation and update algorithm.

The UECC recovery algorithm can be described as follows.

1. Perform the first Symmetric OVS Read.
2. Perform the Asymmetric OVS Read, and create the Sense value.
3. Estimate the threshold offset from the Sense value, in accordance with the characterization curves.
4. Perform a hard decode using the corrected or adjusted threshold based on the Sense value.
5. If the data is recovered successfully, evaluate the correctable error level and possible schedule data reclamation. If the data is not recovered, proceed to Soft decoding. The correctable error level can be defined as a maximum number of errors can be corrected by the ECC engine. The value of the correctable error level can be determined by the ECC engine by calculation or simulation, in accordance with the memory system configuration.

Wherein, the latency of the two OVS reads described above is roughly 3.2 times of the read time tRD.

The proactive background threshold estimation and update algorithm is described as follows.

1. Perform the first Symmetric OVS Read.
2. ECC decode the Hard Data, and make note of the number of corrected errors.
3. Retain the Erasure Data saved from the Symmetric OVS Read.
4. Perform the Asymmetric OVS Read.
5. Compute the threshold Sense value based on the Symmetric OVS Read and Asymmetric OVS Read.
6. Evaluate the resulting Error count, NAND state (program/erase cycle (PEC), Temperature, Read Disturb, etc.), and the threshold Sense value, which can be recorded in the memory system, such as the firmware.
7. If the Error count is higher than an expected value and the threshold Sense value indicates a threshold error, such that the threshold sense value is non-zero, then update the threshold following the Sense value. The expected value can be predetermined, and can keep a certain margin from the correctable error level.

As shown in FIG. 6, when the measured sense value can be obtained following the Symmetric OVS read and Asymmetric OVS read with an initial threshold Vth, as described above. According to the sense value on the y coordination, corresponding characterization points, such as a characterization point 608, can be located on the corresponding characterization curves, such as the average MSB 602, average CSB 604, and average LSB 606, respectively. The x coordination value of the characterization point 608 can be the threshold offsets or errors Ver 610 accordingly. The initial threshold Vth can be adjusted with the threshold error Ver, such as Vth+Ver, wherein the threshold error Ver 610 can be a positive or negative value. Accordingly, for the same measured sense value, each of the characterization curve on FIG. 6 can have an individual characterization point and threshold error Ver, respectively. The threshold measurement and adjustment can be different for MSB, CSB, and LSB.

The method provided in the embodiments of the present invention can significantly reduce the UECC recovery latency, such as by 60%, and decrease the overhead of background media scan operations, such as by 70%. Since the cost of the implementation is so low compared to the traditional methods, more instances of the function can be implemented in the SoC hardware to further increase the performance of the memory system.

The disclosed simple, low cost, efficient method to estimate read threshold errors, can be used to maintain memory system performance and extend the lifetime of the SSD using a 3D TLC NAND. The method can significantly improve effective NAND raw bit error rate (rBER) for hard read with minimal latency. Additionally, this method can greatly reduce power consumption of low power controller when the UECC are encountered.

Figure 7:
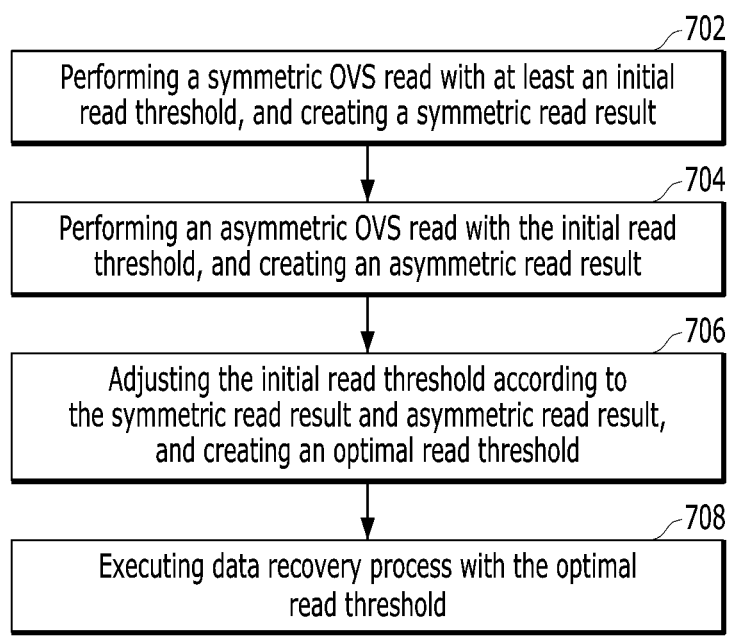
FIG. 7 is a flow chart illustrating a method of optimal threshold estimation of a memory system in accordance with a further embodiment of the present invention.

FIG. 7 is a flow chart illustrating a method of optimal threshold estimation of a memory system in accordance with a further embodiment of the present invention. The method comprising: performing a symmetric OVS read with at least an initial read threshold, and creating a symmetric read result in a block of 702; performing an asymmetric OVS read with at least the initial read threshold, and creating an asymmetric read result in a block of 704; adjusting the initial read threshold according to at least the symmetric read result and asymmetric read result, and creating an optimal read threshold in a block of 706; and executing data recovery process with the optimal read threshold in a block of 708.

Thus, it has been discovered that the architecture of a memory system of the present invention furnishes important and heretofore unknown and unavailable solutions, capabilities, and functional aspects for a unified optimized acceleration architecture. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of a foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An operating method of a memory system comprising:
    performing a symmetric Oversampling (OVS) read with at least an initial read threshold, and creating a symmetric read result;
    performing an asymmetric OVS read with at least the initial read threshold, and creating an asymmetric read result;
    adjusting the initial read threshold according to at least the symmetric read result and asymmetric read result, and creating an optimal read threshold; and
    executing data recovery process with the optimal read threshold.

2. The method of claim 1 wherein the adjusting the initial read threshold includes generating a threshold sense value in accordance with the symmetric read result and asymmetric read result, and creating an adjusted read threshold.

3. The method of claim 2 wherein the adjusting the initial read threshold includes locating a threshold error according to the threshold sense value on a characterization curve.

4. The method of claim 3 wherein the adjusting the initial read threshold includes adjusting the initial read threshold with the threshold error.

5. The method of claim 3 wherein the locating the threshold error on the characterization curve includes locating the threshold error on a linearized characterization curve.

6. The method of claim 1 wherein the performing the symmetric OVS read includes
    performing a hard data read with a read threshold, and storing hard data in a hard data buffer; and
    performing an erasure data read according a higher threshold and a lower threshold, and storing erasure data in an erasure data buffer, wherein the read threshold is the center of the higher threshold and lower threshold.

7. The method of claim 1 wherein the performing the asymmetric OVS read includes
    performing a hard data read with a read threshold, and storing hard data in a hard data buffer; and
    performing an erasure data read according a higher threshold and a lower threshold, and storing erasure data in an erasure data buffer, wherein the read threshold is not the center of the higher threshold and lower threshold.

8. The method of claim 1 wherein the adjusting the initial read threshold includes performing primitive 1's counting, comparing 1's counting results, and estimating a threshold error.

9. The method of claim 1 further comprising utilizing an Uncorrectable Error Correction code (UECC) recovery algorithm and a proactive background threshold estimation and update algorithm.

10. A memory system comprising:
    a processor;
    a tangible computer readable storage medium coupled to the processor, embedding the non-transitory computer program product executed by the processor, including computer instructions configured to:
    perform a symmetric Oversampling (OVS) read with at least an initial read threshold, and create a symmetric read result;
    perform an asymmetric OVS read with at least the initial read threshold, and create an asymmetric read result;
    adjust the initial read threshold according to at least the symmetric read result and asymmetric read result, and create an optimal read threshold; and
    execute data recovery process with the optimal read threshold.

11. An apparatus of a memory system comprising:
    a plurality of memory devices; and
    a controller coupled to the plurality of memory devices, wherein the controller is configured to:
    perform a symmetric Oversampling (OVS) read with at least an initial read threshold, and create a symmetric read result;
    perform an asymmetric OVS read with at least the initial read threshold, and create an asymmetric read result;
    adjust the initial read threshold according to at least the symmetric read result and asymmetric read result, and create an optimal read threshold; and
    execute data recovery process with the optimal read threshold.

12. The apparatus of claim 11 wherein the controller is further configured to generate a threshold sense value in accordance with the symmetric read result and asymmetric read result, and create an adjusted read threshold.

13. The apparatus of claim 12 wherein the controller is further configured to locate a threshold error according to the threshold sense value on a characterization curve.

14. The apparatus of claim 13 wherein the controller is further configured to adjust the initial read threshold with the threshold error.

15. The apparatus of claim 13 wherein the controller is further configured to locate the threshold error on a linearized characterization curve.

16. The apparatus of claim 11 wherein the controller is further configured to
    perform a hard data read with a read threshold, and store hard data in a hard data buffer; and
    perform an erasure data read according a higher threshold and a lower threshold, and store erasure data in an erasure data buffer, wherein the read threshold is the center of the higher threshold and lower threshold.

17. The apparatus of claim 11 wherein the controller is further configured to
- perform a hard data read with a read threshold, and store hard data in a hard data buffer; and
- perform an erasure data read according a higher threshold and a lower threshold, and store erasure data in an erasure data buffer, wherein the read threshold is not the center of the higher threshold and lower threshold.

18. The apparatus of claim 11 wherein the controller is further configured to perform primitive 1's counting, compare 1's counting results, and estimate a threshold error.

19. The apparatus of claim 11 the controller is further configured to utilize an Uncorrectable Error Correction Code (UECC) recovery algorithm and a proactive background threshold estimation and update algorithm.

* * * * *